United States Patent
Danklefsen et al.

(10) Patent No.: US 8,710,872 B2
(45) Date of Patent: Apr. 29, 2014

(54) DRIVER CIRCUIT FOR DRIVING SEMICONDUCTOR SWITCHES

(75) Inventors: Ralph Danklefsen, Unterhaching (DE); Jens Barrenscheen, Munich (DE); Lilla Akrour, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/475,498

(22) Filed: May 18, 2012

(65) Prior Publication Data

US 2013/0307589 A1    Nov. 21, 2013

(51) Int. Cl.
*H03K 3/00* (2006.01)
*H03K 19/003* (2006.01)

(52) U.S. Cl.
CPC ................. *H03K 19/00361* (2013.01)
USPC .......................................................... 327/108

(58) Field of Classification Search
USPC .......... 326/22–27, 82, 83; 327/108–112, 170, 327/389, 391; 365/230.06
See application file for complete search history.

(56) References Cited

U.S. PATENT DOCUMENTS 7,990,184 B2 *  8/2011  Son .................................. 327/87

OTHER PUBLICATIONS

"Isolation Amplifier; Technical Data; HCPL-7800A, HCPL-7800," Agilent Technologies, Mar. 6, 2002, pp. 1-17.
"Precision Timers; Check for Samples: NA555, NE555, SA555, SE555," Texas Instruments, Production Data Description, SLFS022H, Sep. 1973-Revised Jun. 2010, 31 pages.

* cited by examiner

*Primary Examiner* — Sibin Chen
(74) *Attorney, Agent, or Firm* — Slater & Matsil, L.L.P.

(57) ABSTRACT

A driver circuit can be used to drive a semiconductor switch to an on-state or an off-state in accordance with a control signal. The operating voltage range of the control signal is represented by a reference voltage. And input stage receives the control signal and the reference voltage and generates a modified control signal. An output stage is coupled to the input stage and receives the modified control signal. The output stage is configured to provide a driver signal for driving the semiconductor switch on and off in accordance with the modified control signal. The input stage is configured to scale the control signal dependent on the level of the reference voltage, to compare the scaled control signal with at least one threshold value that is responsive to the reference voltage, and to generate the modified control signal dependent on the result of the comparison.

17 Claims, 3 Drawing Sheets

fied control signal dependent on the result of the comparison (s) with the at least one threshold value. Furthermore, a corresponding method for driver a semiconductor switch is disclosed.

DRIVER CIRCUIT FOR DRIVING SEMICONDUCTOR SWITCHES

TECHNICAL FIELD

The invention relates to driver circuits for controlling the switching operation of semiconductor switches, particularly field effect transistors such as MOSFETs and IGBTs.

BACKGROUND

Driver circuits are usually required to switch semiconductor switches on and off in accordance with a (usually binary) control signal which may be provided, e.g., by a micro-controller or similar control circuits. For this purpose the control signal is supplied to the driver circuit that is configured to generate a corresponding driver signal which is supplied to the control electrode of a semiconductor switch and appropriate to switch the semiconductor switch on and off. The driver circuit may also be configured to generate the driver signals such that the switching behavior of the switch matches a specific desired behavior. For example, by generating appropriate driver signals the steepness of the edges of the switched current and/or voltage can be specifically influenced. This "edge shaping" capability is often required to fulfill specific requirements concerning electromagnetic emissions (EMI) and electromagnetic compatibility (EMC).

The mentioned control circuits (e.g., micro controllers) generate the control signal (or a plurality of control signals, one for each semiconductor switch to be controlled) in such a manner that the resulting switching operation corresponds to a desired switching pattern. The control signals are usually binary signals having only two signal levels, namely a low level (logic "0") and a high level (logic "1"). However, the actual potential (in volts) of a "low level" and a "high level" is different for different types of control circuits. For example, a low level may correspond to a potential of 0 volts whereas a high level may correspond to 3.3 volts, 5 volts, 12 volts, or even 15 volts dependent on the employed control circuit. Some control circuits use negative voltages to indicate a low level, e.g., −15 volts, whereas a high level is indicated by +15 volts. Thus, an absolute definition of the control signal levels is usually not possible.

As a consequence, the input signal specification of the driver circuits (e.g., gate driver) must usually match the output signal specification of the control circuit (e.g., micro controller). Thus there is a need for driver circuits for driving semiconductor switches which are capable of processing a wide range of control signal levels.

SUMMARY OF THE INVENTION

A driver circuit for driving a semiconductor switch to an on-state or an off-state in accordance with a control signal is described. The operating voltage range of the control signal is represented by a reference voltage. The circuit includes an input stage that receives the control signal and the reference voltage and generates a modified control signal. The circuit further includes an output stage that is coupled to the input stage downstream thereof for receiving the modified control signal. The output stage is configured to provide a driver signal for driving the semiconductor switch on and off in accordance with the modified control signal. Furthermore, the input stage is configured to scale the control signal dependent on the level of the reference voltage, to compare the scaled control signal with at least one threshold value that is responsive to the reference voltage, and to generate the modified control signal dependent on the result of the comparison (s) with the at least one threshold value. Furthermore, a corresponding method for driver a semiconductor switch is disclosed.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

The desired switching state (on or off) of a semiconductor switch may be indicated by an appropriate voltage level ("high level" or "low level") of a respective binary control signal. Control circuits are used to generate such binary signals as control signals in accordance with a desired switching pattern. The actual voltage level of a high level and a low level is usually different for different types of control circuits. A low level may be indicated by voltages ranging, e.g., from −15 volts to 0 volts, whereas high levels may be indicated by voltage levels ranging from, e.g., 3.3 volts to 15 volts. However, voltages outside these ranges may also be applicable.

The driver circuit receiving the control signal(s) usually includes comparators to discriminate high and low levels. Assuming the control circuits provides a voltage level of 5 volts as high level and a voltage of 0 volts as low level. In this example two comparators using threshold voltages of 1.5 volts and 3.5 volts may be used in an input stage of the driver circuit to discriminate the high and low levels received from the control circuit. In the present example, a change from a low level to a high level is detected when the level of the respective control signal exceeds the 3.5 volt threshold. Similarly, a change from a high level to a low level is detected when the level of the respective control signal falls below the 1.5 volt threshold.

The threshold voltages mentioned above should be adapted to the actual voltage levels of the control signal to allow a robust operation of the semiconductor switch. For example, if a high level of 15 volts is used instead of 5 volts the thresholds have to be adapted to, e.g., 5 volts and 10 volts, respectively. Otherwise the high voltage swing would not have the desired effect of a high signal-to-noise ratio, particularly in noisy environments. Assuming an additive random noise of 3.5 volts and a high level of 15 volts, the low thresholds (1.5 and 3.5 volts) used in the first example would result in erroneous switching operations whereas thresholds of 5 volts and 10 volts would not.

Furthermore, the actual voltage levels of the high and low levels of the control signals are often subject to tolerances up to 10 per cent. That is, a nominal high level of 5 volts may actually be 5.5 volts or only 4.5 volts. Further problems may occur when the levels of the control signal provided by the control circuit are outside the supply voltage range of the driver circuit. To resolve or alleviate the problems mentioned above and to provide a driver circuit which may be used more flexibly, a novel driver circuit has been developed. An exemplary embodiment of the driver circuit is illustrated in FIGS. 1 and 2.

Figure 1:
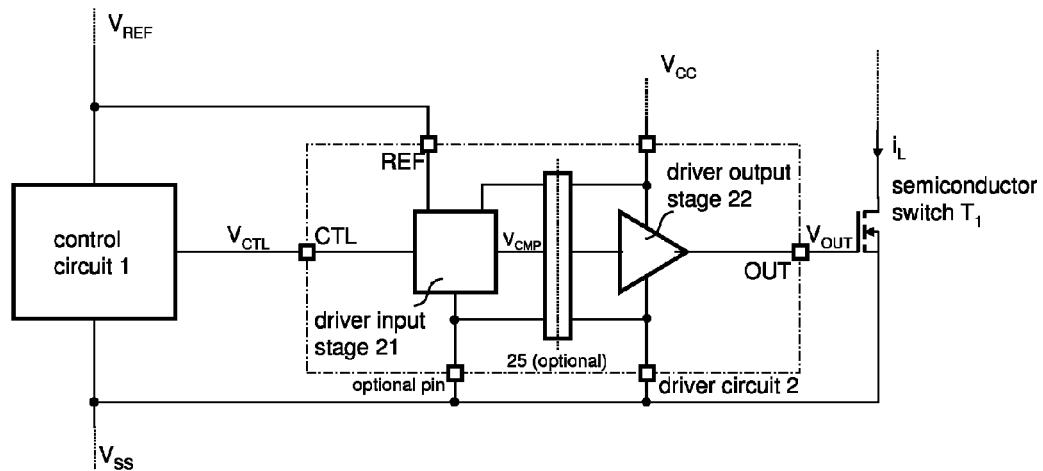
FIG. 1 illustrates a circuit arrangement including a semiconductor switch, a driver circuit for generating driver signals for driving the switch into an on or an off state in accordance with a control signal provided by a control circuit.

FIG. 1 illustrates a semiconductor switch $T_1$ which is a MOS transistor in the present example. The semiconductor switch $T_1$ is connected between a supply potential and a load (not shown) to switch a load current $i_L$, which flows through the load, on and off in accordance with a driver signal $V_{OUT}$ that is supplied to a control electrode of the semiconductor switch $T_1$ (i.e., the gate of the MOS transistor in the present example). The driver signal $V_{OUT}$ is output by a driver circuit 2 which is configured to generate the driver signal $V_{OUT}$ in accordance with a binary control signal $V_{CTL}$. The control signal $V_{CTL}$ is supplied to the driver circuit 2 by a control circuit 1 which may be a micro-controller or other control circuitry which is capable of providing (a) binary control signal(s) which represent(s) a desired switching pattern for the semiconductor switch $T_1$. The MOS transistor $T_1$, the driver circuit 2 and the control circuit 1 are usually integrated in separate semiconductor dies which may be arranged in separate chip packages.

The control circuit 1 is supplied, for example, with a reference voltage $V_{REF}$ and reference potential $V_{SS}$ (e.g. 0 volts or near 0 volts). The supply voltage may be, however, different from the reference voltage in some applications. However, $V_{REF}$ represents the upper voltage rail of the control signal $V_{CTL}$ and may also be generated and provided by the control circuit 1 itself. As a result, the low level of the control signal $V_{CTL}$ equals $V_{SS}$ and the high level of the control signal equals $V_{REF}$. In other words, the potentials $V_{REF}$ and $V_{SS}$ are the voltage rails defining the maximum and minimum potential (i.e., high level and low logic level) of the control signal $V_{CTL}$. The driver circuit 2 is supplied, for example, with a second supply voltage $V_{CC}$ and the potential $V_{SS}$ or, alternatively, ground potential, wherein the second supply potential $V_{CC}$ may be higher or lower than the reference potential $V_{REF}$. The driver circuit 2 includes a driver input stage 21 and a driver output stage 22 connected in series to the driver input stage 21. The input stage 21 receives the control signal $V_{CTL}$ from the control circuit 1 and is configured to detect the logic level (high level or low level) of the control signal $V_{CTL}$ and to forward the detected logic level to the output stage 22 which generates an appropriate driver signal $V_{OUT}$ (e.g., a gate voltage or a gate current having well-defined voltage or, respectively, current gradients). The design of driver output stages 22 is commonly known and not further discussed here. One exemplary implementation of the driver circuit 2 including more details of the driver input stage 21 is illustrated in FIG. 2. Between the input stage 21 and the output stage 22 a galvanic isolation 25 may be provided as an option. A galvanic isolation may be accomplished by employing, e.g., an opto-isolator (optocoupler), a transformer circuit (e.g. an integrated coreless transformer) or the like. In this case the input stage 21 and the output stage 22 may be supplied by separate supply circuits.

Figure 2:
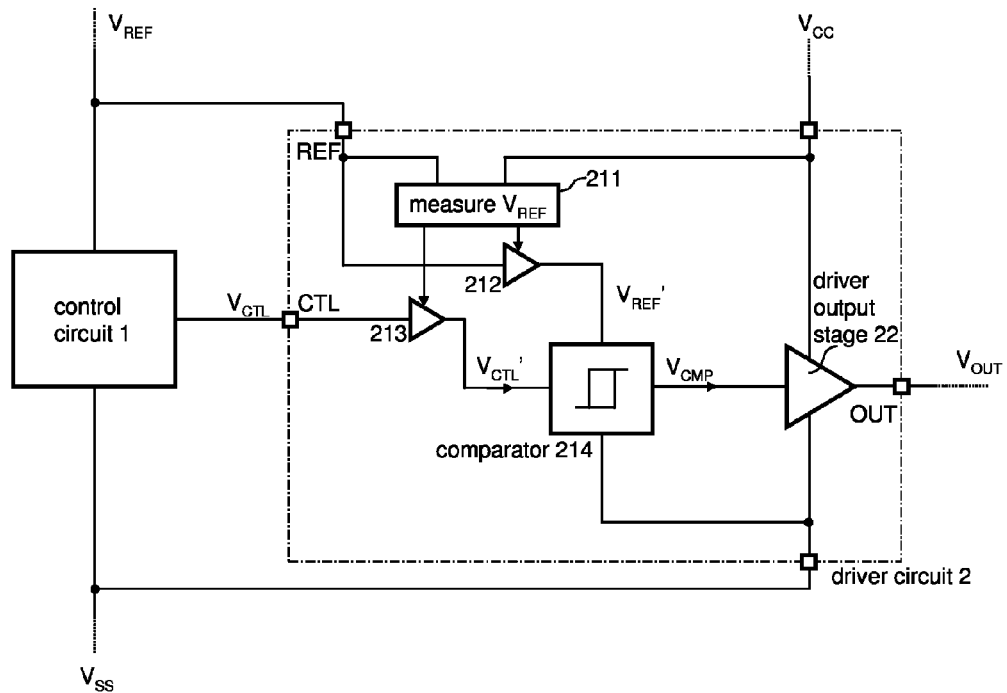
FIG. 2 illustrates one exemplary embodiment of the driver circuit of FIG. 1 in more details.

The circuitry of FIG. 2 corresponds essentially to the circuitry of FIG. 1. The semiconductor switch $T_1$ has been, however, omitted in FIG. 2 to simplify the illustration. As in the example of FIG. 1 the driver circuit 2 includes a driver input stage 21 and a driver output stage 22 coupled to the input stage downstream thereof. The galvanic isolation 25 (see FIG. 1) is not used in this example but could also be included if required by the application. The input stage 21 includes an adjustable amplifier/attenuator circuit 213 configured to scale (i.e., amplify or attenuate) the level of the control signal $V_{CTL}$ wherein the scaling factor (gain or attenuation) is adjustable. The scaled (amplified or attenuated) control signal $V_{CTL}'$ is supplied to a comparator 214 (e.g., with hysteresis to avoid toggling) which is configured to detect the logic level (high level or low level) of the control signal $V_{CTL}'$. The output (comparator signal $V_{CMP}$) of the comparator 214 is coupled to the output stage 22.

The threshold value(s) used by the comparator 214 are set dependent on or are derived from the reference potential $V_{REF}'$ which is supplied to the comparator 214. In the present example, two threshold values are used to provide a comparator hysteresis defined by an upper and a lower threshold. The upper and lower thresholds are derived from the reference voltage $V_{REF}$ (i.e., the supply voltage of or provided by the control circuit 1) which may be scaled before being applied to the comparator 214. For this purpose the driver circuit 2 includes another adjustable amplifier/attenuator circuit 212 which is configured to scale (amplify or attenuate) the level of the reference voltage $V_{REF}$ wherein the scaling factor (gain or attenuation) is adjustable. The amplifier/attenuator circuit 212 provides a scaled reference voltage $V_{REF}'$ which is applied to the comparator 214 which can derive its threshold value therefrom. Other implementations which provide essentially the same function (i.e., scaling the thresholds of the comparator dependent on the reference voltage) are applicable. The scaled reference voltage $V_{REF}'$ can be basis for one of the threshold voltages used by the comparator 214.

The scaling factors (gain or attenuation) of the amplifier/attenuator circuits 212 and 213 are set by the voltage measurement circuit 211 which is configured to measure the reference voltage $V_{REF}$ and to provide a scaled reference signal (i.e., $V_{REF}'$ in the present example) that depends on the level of the reference voltage $V_{REF}$. The input stage 21 of the driver circuit 2 as illustrated in FIG. 2 allows to measure the signaling level (i.e., the upper voltage rail) of the control signal $V_{CTL}$ which corresponds to the level of the reference voltage $V_{REF}$ (with respect to the potential $V_{SS}$). Dependent on the measured voltage level the scaling factor (amplifier/attenuator 213) for the control signal $V_{CTL}$ received from the control circuit 1 is adjusted, and further the thresholds for the window comparator are adjusted (e.g., by amplifier/attenuator 212 and the voltage divider $R_1$, $R_2$, $R_3$). The input stage thus automatically adapts to the signaling level used by the control circuit 1.

Figure 3:
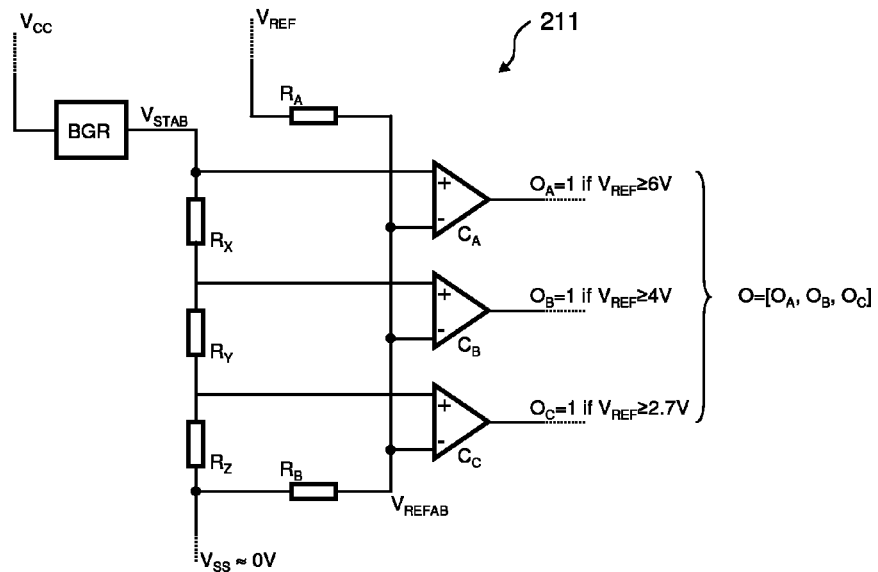
FIG. 3 illustrates one exemplary implementation of the input voltage level measurement used in the example of FIG. 2.

FIG. 3 illustrates one exemplary implementation of the voltage measurement circuit 211 used in the example of FIG. 2. As can be seen from FIG. 2, the circuit 211 is provided with both, the driver supply voltage $V_{CC}$ and the reference voltage $V_{REF}$. If not stabilized, the voltage $V_{CC}$ may be supplied to a voltage stabilization circuit BGR (e.g. a band-gap reference circuit) to generate a stabilized voltage $V_{STAB}$. In many devices used today the voltage $V_{STAB}$ would be used to define the thresholds for the comparator 214 (without scaling capability). The exemplary implementation of the voltage measurement circuit 211 described here includes two or more comparators. In FIG. 3 three comparators $C_A$, $C_B$ and $C_C$ are used to discriminate different values of the reference voltage $V_{REF}$. Each comparator receives a scaled version ($V_{REFAB} = V_{REF} \cdot R_B/(R_A + R_B)$) of the reference voltage $V_{REF}$ via a voltage divider $R_A$, $R_B$. The resistors $R_A$ and $R_B$ are predefined by circuit design. Furthermore, each comparator receives a respective threshold level which is derived from the stabilized voltage $V_{STAB}$. That is, the individual comparators $C_A$, $C_B$ and $C_C$ are configured to compare the scaled reference voltage $V_{REFAB}$ with the respective thresholds which are $V_{STAB}$, $V_{STAB} \cdot (R_Y+R_Z)/(R_X+R_Y+R_Z)$, and $V_{STAB} \cdot R_Z/(R_X+R_Y+R_Z)$. The resistors $R_X$, $R_Y$, $R_Z$ are also predefined by circuit design and form a voltage divider for deriving the mentioned (fixed) threshold levels from the stabilized voltage $V_{STAB}$. It should be noted, however, that the depicted implementation is just one example. A skilled person will be able to find other implementations providing the same function. In the present example the two intermediate taps (providing the threshold levels mentioned above) of the voltage divider $R_X$, $R_X$, $R_Z$ are connected to the comparators $C_B$ and $C_C$ whereas the comparator $C_A$ receives the total voltage $V_{STAB}$ as threshold levels.

The resistors of the voltage dividers $R_X$, $R_X$, $R_Z$, and $R_A$, $R_B$ are, in the present example, designed such that the output $O_A$ of the first comparator $C_A$ is active ($O_A=1$) when the reference voltage $V_{REF}$ is greater than 6V, the output $O_B$ of the second comparator $C_B$ is active ($O_B=1$) when the reference voltage $V_{REF}$ is greater than 4V, and the output $O_C$ of the first comparator $C_C$ is active ($O_C=1$) when the reference voltage $V_{REF}$ is greater than 2.7V. In essence the voltage measurement circuit 211 operates like a 2-bit flash analog-to-digital converter having non-equidistant threshold-levels. The comparator output signals may be regarded as output signal representing the reference voltage $V_{REF}$. The comparator $C_C$, which operates with the 2.7V threshold is mainly used to detect an erroneously unconnected reference input REF (see FIG. 1) of the driver circuit 2. In the present example, a signaling level of, e.g., $V_{REF}=15V$ yields an output of O=[1, 1, 1], a signalling level of, e.g., $V_{REF}=5V$ yields an output of O=[1, 1, 0], a signalling level of, e.g., $V_{REF}=3.3V$ yields an output of O=[1, 0, 0], and a signalling level of, e.g., $V_{REF}=0V$ yields an output of O=[0, 0, 0] indicating a not connected reference input REF as mentioned above. An output O=[0, 0, 0] may be used to signal an error, e.g., to the control circuit 1.

Figure 4:
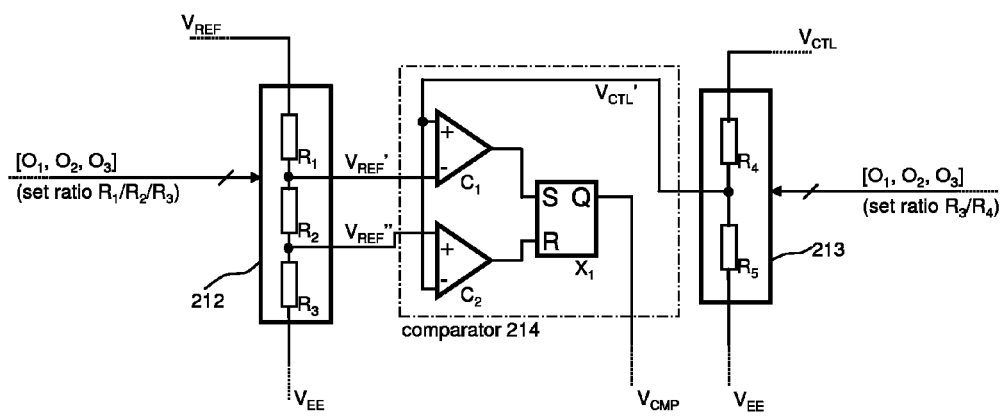
FIG. 4 illustrates one exemplary implementation of the amplifiers/attenuators used in the example of FIG. 2.

FIG. 4 illustrates an exemplary implementation of the adjustable amplifier/attenuator circuits 212 and 213 and the comparator 214. In the present example the amplifier/attenuator circuits 212 and 213 are implemented as resistive voltage dividers and thus can only provide scaling factors lower than or equal to one, i.e., no amplification functionality is provided. However, other implementations may include and amplifier which provides scaling factors greater than one. As can be seen in FIG. 2 the amplifier/attenuator circuit 213 is configured to scale the control signal $V_{CTL}$ before being supplied to the comparator 214. According to the example of FIG. 4 the circuit 213 may be implemented as a voltage divider (symbolized by the resistors $R_4$ and $R_5$) wherein the actual division ratio may be set in accordance with the output signal O=[$O_A$, $O_B$, $O_C$] (the three outputs of the circuit of FIG. 3 may be regarded as one multi-bit output signal or any other signal representing the signal O) which represents the reference voltage $V_{REF}$. An adjustable division ratio may be achieved by using, e.g. programmable resistors (digital potentiometers) or simply by providing a plurality of voltage dividers each having a defined division ratio and electronic switches to switch between the individual voltage dividers dependent on the signal O.

Similarly, the amplifier/attenuator circuit 212 is configured to scale the threshold levels for the comparator 214. According to the example of FIG. 4 the circuit 212 may also be implemented as a voltage divider (symbolized by the resistors $R_1$, $R_2$, and $R_3$) with two intermediate taps wherein the actual division ratio(s) may be set in accordance with the signal O which represents the reference voltage $V_{REF}$. The adjustable division ratio(s) may be achieved the same way as described above with respect to the voltage divider 213. Alternatively, a voltage divider with a fixed ratio may be provided and the input voltage of the voltage divider may be scaled instead to adjust the threshold levels tapped at the intermediate taps of the voltage dividers (see also FIG. 5). In the present example the threshold levels used by the comparators are denoted as $V_{REF}'$ and $V_{REF}''$. The voltage levels $V_{REF}'$ and $V_{REF}''$ are tapped at the voltage divider formed by the resistors $R_1$, $R_2$, and $R_3$ and are thus scaled versions of the reference voltage $V_{REF}$.

The comparator 214 may include a first comparator circuit $C_1$ for detecting a high level and a second comparator circuit $C_2$ for detecting a low level. When the first comparator circuit $C_1$ is triggered by a high level of the control signal $V_{CTL}$ it sets the set-input of an R/S flip flop. Similarly, when the second comparator circuit $C_2$ is triggered by a low level of the control signal $V_{CTL}$ it sets the reset-input of the R/S flip flop. The flip flop output signal $V_{CTL}'$ corresponds to the control signal $V_{CTL}$ provided by the control circuit 1 but has normalized high and low levels independent from the signaling levels used by the control circuit 1.

Figure 5:
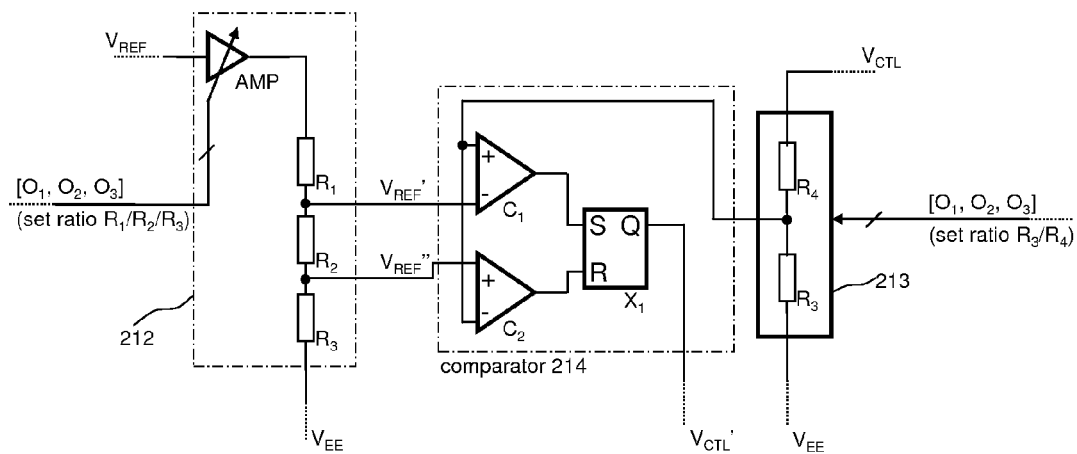
FIG. 5 illustrates an alternative implementation of the example of FIG. 4.

FIG. 5 illustrates an alternative implementation of the example of FIG. 4. Instead of varying the resistors $R_1$, $R_2$, $R_3$ or the voltage divider to adjust the threshold levels for the comparators as it is done in the example of FIG. 4, the input voltage applied to the voltage divider is scaled using an amplifier AMP and resistors $R_1$, $R_2$, $R_3$ having a fixed resistance. Of course the amplifier AMP may be set to scaling factors lower than one.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

What is claimed is:

1. A driver circuit for generating a drive signal in accordance with a control signal that has an operating voltage range represented by a reference voltage, the circuit comprising:
    an input stage configured to receive the control signal and the reference voltage and to generate a modified control signal; and
    an output stage coupled to the input stage downstream thereof and is configured to receive the modified control signal and to provide the drive signal in accordance with the modified control signal;
    wherein the input stage is configured to
      scale the control signal dependent on a level of the reference voltage,
      compare the scaled control signal with at least one threshold value that is related to the reference voltage, and
      generate the modified control signal dependent on a result of the compare, wherein the input stage comprises a first adjustable scaling circuit configured to amplify or attenuate the received control signal in accordance with a first adjustable scaling factor, a second adjustable scaling circuit configured to amplify or attenuate the reference voltage in accordance with a second adjustable scaling factor to obtain the at least one threshold, a comparator circuit configured to compare the scaled control signal with the at least one threshold and to supply the result of the compare as a modified control signal to the output stage, and a measurement circuit configure to provide a measurement signal representative of the level of the reference voltage, wherein the first adjustable scaling factor and the second adjustable scaling factor is related to the measurement signal.

2. The driver circuit of claim 1, wherein the first adjustable scaling circuit comprises a variable gain amplifier having a gain that is related to the measurement signal.

3. The driver circuit of claim 1, wherein the first adjustable scaling circuit comprises a programmable voltage divider having a division ratio that is related to the measurement signal.

4. The driver circuit of claim 1, wherein the input stage is configured to compare the scaled control signal with two different threshold values thus providing a comparison with hysteresis.

5. The driver circuit of claim 4, wherein the input stage comprises a comparator circuit with hysteresis, the comparator being configured to compare the scaled control signal with the two different threshold values to form a comparison result, and to supply the comparison result as the modified control signal to the output stage.

6. The driver circuit of claim 1, wherein the measurement circuit includes a plurality of comparators configured to compare the reference voltage with a plurality of corresponding threshold values, the output signal being representative of a comparator state representing respective comparison results.

7. The driver circuit of claim 1, wherein the output stage is configured to provide the drive signal for driving a semiconductor switch on and off in accordance with the modified control signal.

8. The driver circuit of claim 1, further comprising a semiconductor switch, wherein the output stage is configured to drive the semiconductor switch on and off in accordance with the modified control signal.

9. A driver circuit for generating a drive signal in accordance with a control signal that has an operating voltage range represented by a reference voltage, the circuit comprising:

an input stage configured to receive the control signal and the reference voltage and to generate a modified control signal; and an output stage coupled to the input stage downstream thereof and is configured to receive the modified control signal and to provide the drive signal in accordance with the modified control signal;

wherein the input stage is configured to:
scale the control signal dependent on a level of the reference voltage,
compare the scaled control signal with at least one threshold value that is related to the reference voltage,
generate the modified control signal dependent on a result of the compare,
compare the scaled control signal with two different threshold values thus providing a comparison with hysteresis, wherein the two different threshold values are set responsive to a measurement signal representative of the reference voltage.

10. The driver circuit of claim 9, wherein the two different threshold values are tapped from a voltage divider that has a programmable division ratio that depends on the reference voltage.

11. The driver circuit of claim 9, wherein the two different threshold values are tapped from a voltage divider that has a fixed division ratio but is supplied with a scaled reference voltage.

12. A method comprising:
receiving a control signal and a reference voltage, the control signal having an operating voltage range represented by the reference voltage;
scaling the control signal dependent on a level of the reference voltage;
comparing the scaled control signal with a threshold value that is related to the reference voltage, wherein comparing the scaled control signal with the threshold value comprises comparing the scaled control signal with two different threshold values, and the two different threshold values are set responsive to a measurement signal representative of the reference voltage;
generating a modified control signal dependent on a result of the comparing of the scaled control signal and the threshold value; and
generating a driver signal in accordance with the modified control signal ($V_{CMP}$).

13. The method of claim 12, further comprising driving a semiconductor switch on and off with the driver signal.

14. The method of claim 12, wherein the comparing determines a hysteresis.

15. The method of claim 12, wherein the two different threshold values are tapped from a voltage divider that has a programmable division ratio that depends on the reference voltage.

16. The method of claim 12, wherein the two different threshold values are tapped from a voltage divider that has a fixed division ratio but is supplied with a scaled reference voltage.

17. A driver circuit for driving a semiconductor switch to an on-state or an off-state in accordance with a control signal that has an operating voltage range represented by a reference voltage, the circuit comprising:

a first adjustable scaling circuit configured to amplify or attenuate the control signal in accordance with a first adjustable scaling factor to generate a scaled control signal;

a second adjustable scaling circuit configured to amplify or attenuate the reference voltage in accordance with a second adjustable scaling factor to obtain a threshold;

a measurement circuit configured to provide a measurement signal representative of a level of the reference voltage, wherein the first adjustable scaling factor and the second scaling factor is related to the measurement signal;

a comparator circuit configured to compare the scaled control signal with the threshold and to generate a modified control signal; and an output stage coupled to receive the modified control signal and to provide a drive signal for driving the semiconductor switch on and off in accordance with the modified control signal.

* * * * *